US012283487B2

(12) United States Patent
Horikiri et al.

(10) Patent No.: US 12,283,487 B2
(45) Date of Patent: Apr. 22, 2025

(54) METHOD FOR MANUFACTURING STRUCTURE

(71) Applicant: SUMITOMO CHEMICAL COMPANY, LIMITED, Tokyo (JP)

(72) Inventors: Fumimasa Horikiri, Hitachi (JP); Noboru Fukuhara, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 526 days.

(21) Appl. No.: 17/629,157

(22) PCT Filed: Jul. 6, 2020

(86) PCT No.: PCT/JP2020/026455
§ 371 (c)(1),
(2) Date: Jan. 21, 2022

(87) PCT Pub. No.: WO2021/020041
PCT Pub. Date: Feb. 4, 2021

(65) Prior Publication Data
US 2022/0270887 A1    Aug. 25, 2022

(30) Foreign Application Priority Data
Jul. 30, 2019    (JP) .................................. 2019-140028

(51) Int. Cl.
*H01L 21/3063*    (2006.01)
*H01L 21/306*    (2006.01)
(52) U.S. Cl.
CPC ................. *H01L 21/30635* (2013.01); *H01L 21/30612* (2013.01)
(58) Field of Classification Search
CPC ..................... H01L 21/30635; H01L 21/30612
See application file for complete search history.

(56) References Cited

U.S. PATENT DOCUMENTS

2006/0154391 A1    7/2006    Tran et al.
2007/0281484 A1    12/2007    Ishibashi et al.
(Continued)

FOREIGN PATENT DOCUMENTS

JP    2001-044169 A    2/2001
JP    2005-136002 A    5/2005
(Continued)

OTHER PUBLICATIONS

Adesida et al. ("Dry and Wet Etching for Group III—Nitride", MRS Internet J. Nitride Semiconductor Res. 4S1, G1.4 (Year: 1999).*
International Preliminary Report on Patentability on PCT/JP2020/026455 dated Feb. 1, 2022 (9 pages).
(Continued)

*Primary Examiner* — Binh X Tran
(74) *Attorney, Agent, or Firm* — Foley & Lardner LLP

(57) ABSTRACT

There is provided a method for manufacturing a structure, including:
applying a first etching to a surface of a member, at least the surface being composed of Group III nitride; and applying a second etching to the surface to which the first etching has been applied, wherein in applying the first etching, a flat portion and a protruding portion are formed, the flat portion being newly appeared on the surface by etching, and the protruding portion being raised with respect to the flat portion, which is caused by being less likely to be etched than the flat portion, and in applying the second etching, the protruding portion is lowered by etching the protruding portion.

16 Claims, 8 Drawing Sheets

(56) References Cited

U.S. PATENT DOCUMENTS

| | | | |
|---|---|---|---|
| 2009/0057811 A1 | 3/2009 | Murakami et al. | |
| 2009/0273060 A1* | 11/2009 | Ishibashi | C30B 29/403 |
| | | | 438/692 |
| 2011/0204379 A1 | 8/2011 | Sato | |
| 2013/0011656 A1* | 1/2013 | Zhang | C25F 3/12 |
| | | | 205/684 |
| 2018/0112325 A1* | 4/2018 | Ishii | C25F 3/02 |
| 2019/0088494 A1* | 3/2019 | Youtsey | H01L 31/02363 |

FOREIGN PATENT DOCUMENTS

| | | | |
|---|---|---|---|
| JP | 2007305748 A | * | 11/2007 |
| JP | 2008-527717 A | | 7/2008 |
| JP | 2009-054837 A | | 3/2009 |
| JP | 2011-171640 A | | 9/2011 |
| JP | 2018-067689 A | | 4/2018 |

OTHER PUBLICATIONS

Murata et al., "Photo-electrochemical etching of free-standing GaN wafer surfaces grown by hydride vapor phase epitaxy", Electrochimica Acta, vol. 171, 2015, pp. 89-95.

Samukawa, Seiji, "Ultimate Top-down Etching Processes for Future Nanoscale Devices: Advanced Neutral-Beam Etching," Japanese Journal of Applied Physics, vol. 45, No. 4A, 2006, pp. 2395-2407.

Faraz et al., "Atomic Layer Etching: What CanWe Learn from Atomic Layer Deposition?" ECS J Journal of Solid State Science and Technology, vol. 4, No., 6, 2015, pp. N5023-5032.

International Searching Authority, "International Search Report," Issued in connection with International Patent Application No. PCT/JP2020/026455, dated Jul. 28, 2020.

International Searching Authority, "Written Opinion," issued in connection with International Patent Application No. PCT/JP2020/026455, dated Jul. 28, 2020.

* cited by examiner

US 12,283,487 B2

METHOD FOR MANUFACTURING STRUCTURE

CROSS-REFERENCE TO RELATED APPLICATIONS

The present application claims priority under 37 U.S.C. § 371 to International Patent Application No. PCT/JP2020/026455, filed Jul. 6, 2020, which claims priority to and the benefit of Japanese Patent Application No. 2019-140028, filed on Jul. 30, 2019. The contents of these applications are hereby incorporated by reference in their entireties.

TECHNICAL FIELD

The present invention relates to a method for manufacturing a structure.

DESCRIPTION OF RELATED ART

Group III nitrides such as gallium nitride (GaN) are used as materials for manufacturing semiconductor devices such as light emitting devices and transistors. Further, the Group III nitrides are also attracting attention as materials for a microelectromechanical system (MEMS).

Photoelectrochemical (PEC) etching has been proposed as an etching technique for forming various structures on Group III nitrides such as GaN (see, for example, Non-Patent document 1). PEC etching is a wet etching with less damage than general dry etching, and the PEC etching is preferable in the point that an apparatus is simpler than special dry etching with less damage such as neutral particle beam etching (see, for example, Non-Patent Document 2) and atomic layer etching (see, for example, Non-Patent Document 3).

When manufacturing a semiconductor device composed of Group III nitride using PEC etching, the flatness of a bottom of a recess portion formed by PEC etching affects the characteristics of the semiconductor device.

PRIOR ART DOCUMENT

Non-Patent Document

[Non-patent document 1] J. Murata et al., "Photo-electrochemical etching of free-standing GaN wafer surfaces grown by hydride vapor phase epitaxy", Electrochimica Acta 171 (2015) 89-95

[Non-Patent Document 2] S. Samukawa, JJAP, 45(2006) 2395.

[Non-Patent Document 3] T. Faraz, ECS J. Solid Stat. Scie. & Technol., 4, N5023 (2015).

SUMMARY OF THE INVENTION

Problem to be Solved by the Invention

An object of the present invention is to provide a technique for improving a flatness of a surface formed by applying PEC etching to a group III nitride.

Means for Solving the Problem

According to an aspect of the present invention, there is provided a method for manufacturing a structure, including: applying a first etching to a surface of a member, at least the surface being composed of Group III nitride; and applying a second etching to the surface to which the first etching has been applied, wherein in applying the first etching, a flat portion and a protruding portion are formed, the flat portion being newly appeared on the surface by etching, and the protruding portion being raised with respect to the flat portion, which is caused by being less likely to be etched than the flat portion, and in applying the second etching, the protruding portion is lowered by etching the protruding the protruding portion.

Advantage of the Invention

There is provided a technique for improving a flatness of a surface formed by applying PEC etching to Group III nitride.

DETAILED DESCRIPTION OF THE INVENTION

First Embodiment

Figure 1A:
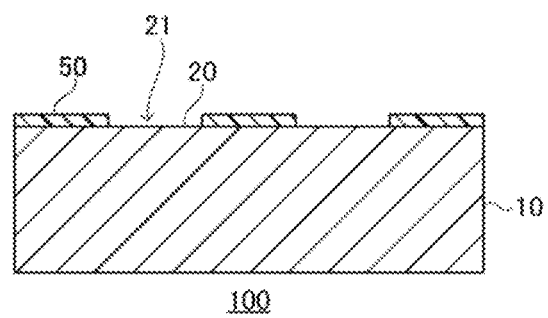
FIG. 1 (a) is a schematic cross-sectional view illustrating a wafer, and FIG. 1 (b) is a schematic cross-sectional view of a PEC etching apparatus, illustrating a PEC etching step.

A method for manufacturing a structure 150 according to a first embodiment of the present invention will be described. The method for manufacturing the structure 150 according to the present embodiment includes: applying a first etching to a surface 20 of an etching object 10; and applying a second etching to the surface 20 to which the first etching has been applied.

The structure 150 is a member including the etching object 10 subjected to the first etching and the second etching (hereinafter, also referred to as a processed wafer 10), that is, may be a member including the processed wafer 10 provided with other member such as an electrode as needed (such as a semiconductor device, a microelectromechanical system (MEMS), etc.), or may be the processed wafer 10 itself (see FIGS. 4 (a) to 4 (c)).

First, the step of applying the first etching will be described. FIG. 1 (a) is a schematic cross-sectional view illustrating the etching object 10 (hereinafter, also referred to as a wafer 10). The wafer 10 is a member with at least the surface 20 composed of Group III nitride, the surface 20 being subjected to the first etching.

The wafer 10 may be a group III nitride substrate such as a gallium nitride (GaN) substrate, or further, for example, it may be an epitaxial substrate in which a group III nitride layer is epitaxially grown on the growth substrate. The growth substrate of the epitaxial substrate may be a dissimilar substrate such as a sapphire substrate, a silicon carbide (SiC) substrate, a silicon (Si) substrate, or the like, or further, for example, it may be the same type of substrate such as a GaN substrate. Further, the growth substrate of the epitaxial substrate may be, for example, semi-insulating, or may be, for example, conductive. Here, the "semi-insulating" means, for example, a state in which a specific resistance is 105 Ωcm or more. In contrast, for example, a state in which the specific resistance is less than 105 Ωcm is called "conductive".

The surface 20 is preferably composed of a c-plane of Group III nitride crystal. Here, the phrase "composed of the c-plane" means that a lowest index crystal plane closest to the surface 20 is the c-plane of the Group III nitride crystal constituting the surface 20. The Group III nitride constituting the surface 20 has dislocations (through dislocations), and the dislocations are distributed at a predetermined density in the surface 20.

As the first etching, photoelectrochemical (PEC) etching is performed. The PEC etching is applied to a region 21 to be etched which is at least a part of the surface 20. The etching object 100 to be processed by the PEC etching (hereinafter, also referred to as the PEC object 100) has a wafer 10, and if necessary, has a mask 50 or the like provided on the wafer 10.

The mask 50 defines a region 21 to be etched on the surface 20. The mask 50 may be made of a conductive material such as titanium (Ti), and further, for example, it may be made of a non-conductive material such as resist or silicon oxide. The PEC object 100 may be the wafer 10 itself without the mask 50, and the region 21 to be etched may be an entire surface of the surface 20 of the wafer 10.

Figure 1B:
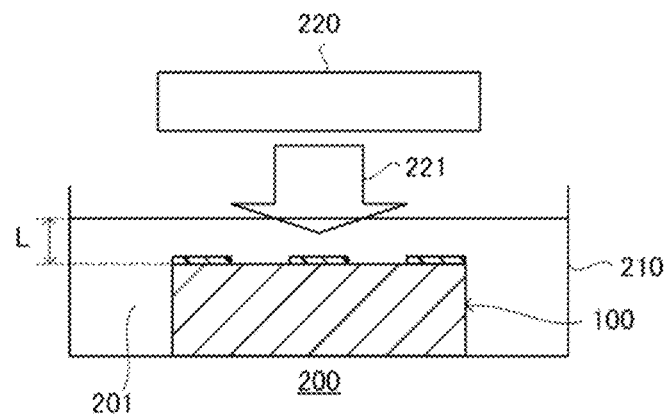

FIG. 1(b) is a schematic cross-sectional view of the PEC etching apparatus 200, illustrating a step of performing the first etching (hereinafter, also referred to as a PEC etching step). The PEC etching apparatus 200 includes a container 210 for accommodating an etching solution 201 and a light source 220 for emitting ultraviolet (UV) light 221.

In the PEC etching step, the region 21 to be etched is irradiated with UV light 221 through the etching solution 201, with the PEC object 100 immersed in the etching solution 201. Thereby, a surface 120 (hereinafter, also referred to as a surface 120 after PEC), which is the surface 20 subjected to PEC etching, is formed. The surface 120 after PEC may be regarded as a bottom 120 of a region 110 (hereinafter, also referred to as a removal region 110) from which the Group III nitride has been removed by PEC etching on the wafer 10 (see FIG. 2 (a)). After performing etching to a predetermined depth, the PEC etching step is finished.

A mechanism of the PEC etching and the like will be described in more detail. GaN will be described as an example of the Group III nitride to be etched.

As the etching solution 201 for the PEC etching, alkaline or acidic etching solution 201 is used, containing oxygen used to generate oxides of group III elements contained in the Group III nitride that constitutes the region 21 to be etched (meaning the bottom 120 after the recess portion 110 have begun to be formed), and further containing an oxidizing agent that receives electrons.

As the oxidizing agent, peroxodisulfate ion ($S_2O_8^{2-}$) is exemplified. Hereinafter, an embodiment of supplying $S_2O_8^{2-}$ from potassium persulfate ($K_2S_2O_8$) will be exemplified. However, $S_2O_8^{2-}$ may be supplied from others, for example, from sodium peroxodisulfate ($Na_2S_2O_8$), ammonium peroxodisulfate (ammonium persulfate, $(NH_4)_2S_2O_8$), or the like.

A first example of the etching solution 201 includes those in which potassium hydroxide (KOH) aqueous solution and potassium persulfate ($K_2S_2O_8$) aqueous solution are mixed and which show alkalinity at the start of PEC etching. Such an etching solution 201 is prepared, for example, by mixing 0.01 M KOH aqueous solution and 0.05 M $K_2S_2O_8$ aqueous solution at a ratio of 1:1. The concentration of the KOH aqueous solution, the concentration of the $K_2S_2O_8$ aqueous solution, and the mixing ratio of these aqueous solutions may be appropriately adjusted as necessary. The etching solution 201 in which the KOH aqueous solution and the $K_2S_2O_8$ aqueous solution are mixed can be made acidic at the start of PEC etching, for example, by lowering the concentration of the KOH aqueous solution.

A PEC etching mechanism when using the etching solution 201 of the first example will be described. By irradiating the region 21 to be etched with UV light 221 having a wavelength of 365 nm or less, holes and electrons are generated as a pair in the GaN constituting the region 21 to be etched. The generated holes decompose GaN into $Ga^{3+}$ and $N_2$ (Chemical formula 1), and further, $Ga^{3+}$ is oxidized by hydroxide ions ($OH^-$) to generate gallium oxide ($Ga_2O_3$) (Chemical formula 2). Then, the generated $Ga_2O_3$ is dissolved in an alkali (or acid). In this way, PEC etching of GaN is performed. The generated holes react with water and the water is decomposed to generate oxygen (Chemical formula 3).

$$GaN(s) + 3h^+ \rightarrow Ga^{3+} + 1/2 N_2(g) \uparrow \quad \text{[Chemical formula 1]}$$

$$Ga^{3+} + 3OH^- \rightarrow 1/2 Ga_2O_3(s) + 3/2 H_2O(l) \quad \text{[Chemical formula 2]}$$

$$H_2O(l) + 2h^+ \rightarrow 1/2 O_2(g) \uparrow + 2H^+ \quad \text{[Chemical formula 3]}$$

Further, dissolution of $K_2S_2O_8$ in water produces peroxodisulfate ion ($S_2O_8^{2-}$) (Chemical formula 4), and irradiation of $S_2O_8^{2-}$ with UV light 221 produces sulfate ion radical ($SO_4^-$* radical) (Chemical formula). 5). The electrons generated in pairs with the holes react with water together with $SO_4^-$* radicals, and the water is decomposed to generate hydrogen (Chemical formula 6). In this way, in the PEC etching of the present embodiment, by using $SO_4^-$* radicals, it is possible to consume the electrons generated in pairs with the holes in the GaN, and therefore the PEC etching can progress satisfactorily. As shown in (Chemical formula 6), as the sulfate ion ($SO_4^{2-}$) increases with a progress of PEC etching, the acidity of the etching solution 201 becomes stronger (pH decreases).

$$K_2S_2O_8 \rightarrow 2K^+ + S_2O_8^{2-} \quad \text{[Chemical formula 4]}$$

$$S_2O_8^{2-} + \text{heat or } h\nu \rightarrow 2SO_4^-* \quad \text{[Chemical formula 5]}$$

$$2SO_4^-* + 2e^- + 2H_2O(l) \rightarrow 2SO_4^{2-} + 2HO* + H_2(g) \uparrow \quad \text{[Chemical formula 6]}$$

A second example of the etching solution 201 includes phosphoric acid ($H_3PO_4$) aqueous solution and potassium persulfate ($K_2S_2O_8$) aqueous solution which are mixed and show acidity at the start of PEC etching.

Such an etching solution 201 is prepared, for example, by mixing a 0.01 M $H_3PO_4$ aqueous solution and a 0.05 M $K_2S_2O_8$ aqueous solution at a ratio of 1:1. The concentration of the $H_3PO_4$ aqueous solution, the concentration of the $K_2S_2O_8$ aqueous solution, and the mixing ratio of these aqueous solutions may be appropriately adjusted as necessary. Since both the $H_3PO_4$ aqueous solution and the $K_2S_2O_8$ aqueous solution are acidic, the etching solution 201 in which the $H_3PO_4$ aqueous solution and the $K_2S_2O_8$ aqueous solution are mixed, is acidic at an arbitrary mixing ratio. Since the $K_2S_2O_8$ aqueous solution itself is acidic, only the $K_2S_2O_8$ aqueous solution may be used as the etching solution 201 which is acidic at the start of etching. In this case, the concentration of the $K_2S_2O_8$ aqueous solution may be, for example, 0.025M.

It is preferable that the etching solution 201 is acidic from the start of PEC etching from a viewpoint of facilitating the use of a resist as the mask 50. This is because the resist mask is easily peeled off when the etching solution 201 is alkaline. When Ti or silicon oxide is used as the mask 50, there is no particular problem whether the etching solution 201 is acidic or alkaline.

As for a PEC etching mechanism when using the etching solution 201 of the second example, it is presumed that (chemical formula 1) to (chemical formula 3) described in the case of using the etching solution 201 of the first example are replaced with (chemical formula 7). That is, $Ga_2O_3$, hydrogen ions ($H^+$), and $N_2$ are generated by a reaction of GaN, holes generated by irradiation with UV light 221 and water (Chemical formula 7). Then, the generated $Ga_2O_3$ is dissolved in the acid. In this way, PEC etching of GaN is performed. The mechanism of consuming the electrons generated in pairs with the holes, by $S_2O_8^{2-}$ as shown in (Chemical formula 4) to (Chemical formula 6) is the same as in the case of using the etching solution 201 of the first example.

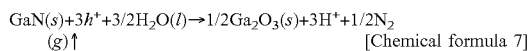

[Chemical formula 7]

As shown in (chemical formula 5), as a technique of generating $SO_4^*$ radicals from $S_2O_8^2$, at least one of the irradiation with UV light 221 and heating can be used. When using the irradiation with UV light 221, in order to increase a light absorption by $S_2O_8^{2-}$ and efficiently generate $SO_4^{-*}$ radicals, it is preferable that a wavelength of the UV light 221 is 200 nm or more and less than 310 nm. That is, from a viewpoint of efficiently generating holes in the Group III nitride in the wafer 10 and generating $SO_4^{-*}$ radicals from $S_2O_8^{2-}$ in the etching solution 201 by irradiation with UV light 221, the wavelength of the UV light 221 is preferably 200 nm or more and less than 310 nm. When the generation of $SO_4^{-*}$ radicals from $S_2O_8^{2-}$ is performed by heating, the wavelength of the UV light 221 may be 310 nm or more (at 365 nm or less).

When generating $SO_4^{-*}$ radicals from $S_2O_8^{2-}$ by irradiation with UV light 221, a distance (wafer arrangement depth) L (see FIG. 1(b)) from the surface 20 of the wafer 10 to the upper surface of the etching solution 201 is preferably 1 mm or more and 100 mm or less, for example. When the distance L is excessively short, for example, less than 1 mm, an amount of $SO_4^{-*}$ radicals generated in the etching solution 201 above the wafer 10 may become unstable due to a fluctuation in the distance L. When the distance L is short, it becomes difficult to control a height of the liquid surface. Therefore, the distance L is preferably 1 mm or more, more preferably 3 mm or more, and further preferably 5 mm or more. Further, when the distance L is excessively long, for example, more than 100 mm, a large amount of $SO_4^{-*}$ radicals that do not contribute to PEC etching are unnecessarily generated in the etching solution 201 above the wafer 10, and therefore utilization efficiency of the etching solution 201 is reduced.

PEC etching can also be performed to Group III nitrides other than the exemplified GaN. The group III element contained in the Group III nitride may be at least one of aluminum (Al), gallium (Ga) and indium (In). The concept of the PEC etching for the Al component or In component in the Group III nitride is the same as the concept described for the Ga component with reference to (Chemical formula 1) and (Chemical formula 2), or (Chemical formula 7). That is, the PEC etching can be performed by forming holes by irradiation with UV light 221 to generate an oxide of Al or an oxide of In, and dissolving these oxides in an alkali or an acid. The wavelength of the UV light 221 may be appropriately changed depending on the composition of the Group III nitride to be etched. When Al is contained, light having a shorter wavelength may be used, and when In is contained, light having a longer wavelength can also be used, with the PEC etching of GaN as a reference. That is, light having a wavelength for PEC-etching the Group III nitride, can be appropriately selected and used depending on the composition of the Group III nitride to be processed.

Figure 8:
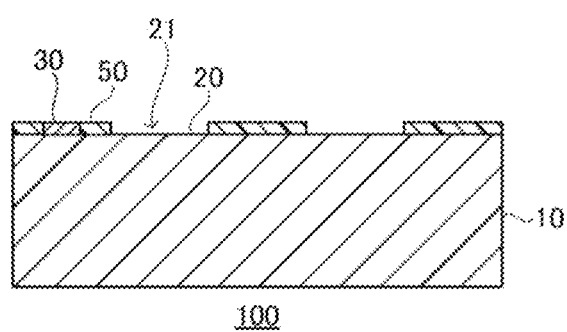
FIG. 8 is a schematic cross-sectional view illustrating a PEC object having a cathode pad.

When using the mask 50 made of a non-conductive material, with the epitaxial substrate having a semi-insulating substrate as the wafer 10, a cathode pad 30 as described below may be used to promote the PEC etching. FIG. 8 is a schematic cross-sectional view illustrating the PEC object 100 having the cathode pad 30. The cathode pad 30 is a conductive member made of a conductive material, and is provided so as to be in contact with at least a part of the surface of the conductive region of the wafer 10 which is electrically connected to the region 21 to be etched. The cathode pad 30 is provided so that at least a part of the cathode pad 30, for example, an upper surface thereof comes into contact with the etching solution 201 during the PEC etching.

As understood from (Chemical formula 1) and (Chemical formula 2), or (Chemical formula 7), the region 21 to be etched where the PEC etching occurs is considered to function as an anode in which holes are consumed. Further, as understood from (Chemical formula 6), it is considered that the surface of the cathode pad 30 in contact with the etching solution 201 functions as a cathode in which electrons are consumed (released), the cathode pad 30 being a conductive member electrically connected to the region 21 to be etched. In this way, the cathode pad 30 may be used to promote the PEC etching.

The above description exemplifies the PEC etching in a mode in which electrons are consumed by including an oxidizing agent that receives electrons in the etching solution 201. However, the PEC etching may be performed in other mode. Specifically, the PEC etching may be performed in a mode of consuming electrons, by making the cathode electrode immersed in the etching solution 201 without including an oxidizing agent therein, and electrically connecting the region 21 to be etched to be the anode electrode, and the cathode electrode, by an external circuit.

Figure 2A:
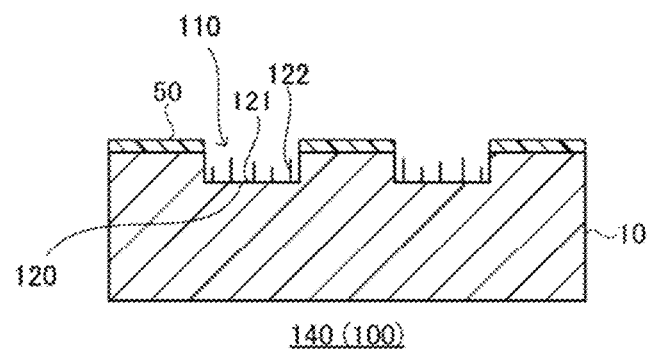
FIG. 2 (a) is a schematic cross-sectional view illustrating a wafer subjected to PEC etching, and FIG. 2 (b) is a schematic cross-sectional view of a flattening etching apparatus, illustrating a flattening etching step.
Figure 2B:
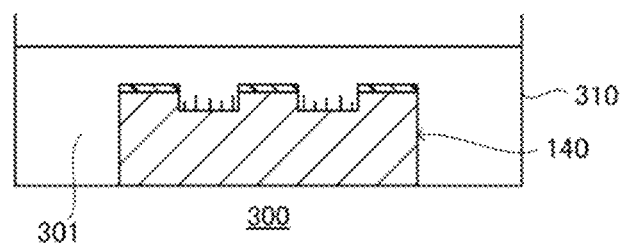

Next, the step of performing the second etching will be described. By the step of performing the first etching (PEC etching step), the surface 120 (the surface 120 after PEC) which is the surface 20 subjected to the PEC etching, is formed. FIG. 2 (a) is a schematic cross-sectional view illustrating the wafer 10 subjected to the PEC etching.

As described above, dislocations are distributed at a predetermined density on the surface 20 of the wafer 10. In the dislocations, a hole lifetime is short, so PEC etching is unlikely to occur. Therefore, a protruding portion 122 is likely to be formed as an undissolved portion of the PEC etching at a position corresponding to the dislocation on the surface 120 after PEC. That is, in the PEC etching step, a flat portion 121 (the portion where the PEC etching has progressed without dislocation) that newly appears by the PEC etching, and a protruding portion 122 that is raised with respect to the flat portion 121, which occurs because the PEC etching is less likely to occur than the flat portion 121, are formed on the surface 120 after PEC. Since the protruding portion 122 is the undissolved portion of the PEC etching, its height is at most a depth (thickness) of the removal region 110 or less.

In the second etching step (hereinafter, also referred to as a flattening etching step), a second etching is applied to the surface 120 after PEC (hereinafter, also referred to as flattening etching). The wafer 10 on which the surface 120 after PEC is formed, becomes an object 140 (hereinafter, also referred to as a flattening object 140) in the flattening etching process of the flattening etching step.

In the flattening etching step, more specifically, the protruding portion 122 is lowered by etching the protruding portion 122 (selectively with respect to the flat portion 121). The "flattening" means that the flatness of the surface 120 after PEC is improved as compared with that before the flattening etching, by lowering the protruding portion 122.

As the flattening etching, for example, wet etching using an acidic or alkaline etching solution (not PEC etching) is used. As an etching solution for the flattening etching, for example, hydrochloric acid (HCl) aqueous solution, mixed aqueous solution of hydrochloric acid (HCl) and hydrogen peroxide ($H_2O_2$) (hydrochloric acid hydrogen peroxide), mixed aqueous solution of sulfuric acid ($H_2SO_4$) and hydrogen peroxide ($H_2O_2$) (piranha solution), tetra hydroxide hydrochloric acid (TMAH) aqueous solution, hydrogen peroxide aqueous solution (sulfuric acid), potassium hydroxide (KOH) aqueous solution, etc., may be used.

FIG. 2 (*b*) is a schematic cross-sectional view of a flattening etching apparatus 300, illustrating a flattening step (that is, a flattening etching step). The flattening etching apparatus 300 has a container 310 for accommodating an etching solution 301. In the flattening etching step, the protruding portion 122 is etched by immersing a flattening object 140 in the etching solution 301 so that the recess portion 110 comes into contact with the etching solution 301. Thereby, the surface 120 after PEC of the recess portion 110 is flattened. After etching the protruding portion 122 so as to have a predetermined low level, the flattening etching step is finished.

The flattening etching is not a PEC etching. Therefore, in the flattening etching step, the surface 20 of the wafer 10 is not irradiated with UV light. Here, "not irradiated with UV light" means to prevent irradiation of (strong) UV light that causes unnecessary PEC etching.

It is known that it is difficult to etch the c-plane of Group III nitride such as GaN, but the PEC etching can etch the Group III nitride regardless of a crystal orientation, and therefore even the c-plane can be etched. The PEC etching in the PEC etching step etches the Group III nitride constituting the surface 20 from a direction perpendicular to the surface 20 (that is, in a thickness direction of the wafer 10) by irradiation with UV light 221 from above the surface 20 of the wafer 10 which is the c-plane.

In contrast, the flattening etching is performed as normal wet etching, which is not PEC etching, using, for example, an etching solution such as hydrochloric acid hydrogen peroxide. In the normal wet etching, it is difficult to etch the c-plane of the Group III nitride, and therefore the flat portion 121 composed of the c-plane on the surface 120 after PEC, is not etched. However, since the protruding portion 122 of the bottom 120 includes a crystal plane other than the c-plane, it can be etched by the normal etching. Accordingly, by the flattening etching, the protruding portion 122 can be selectively etched with respect to the flat portion 121. The flattening etching is to etch a crystal plane other than the c-plane, that is, a crystal plane intersecting the c-plane, so that the protruding portion 122 is etched from a direction that is not perpendicular to the c-plane (that is, in a direction that intersects the thickness direction of the wafer 10 (lateral direction)).

By etching the protruding portion 122 by flattening etching, the protruding portion 122 can be lowered to bring the surface 120 after PEC closer to flat, that is, the protruding portion 122 can be brought closer to the c-plane constituting the flat portion 121. When the protruding portion 122 is etched and close to the c-plane, the etching becomes difficult to progress. Therefore, in the flattening etching step of the present embodiment, it is easy to finish the flattening etching in a state where the protruding portion 122 is suppressed from being excessively etched and the surface 120 after PEC is substantially flat.

Figure 3A:
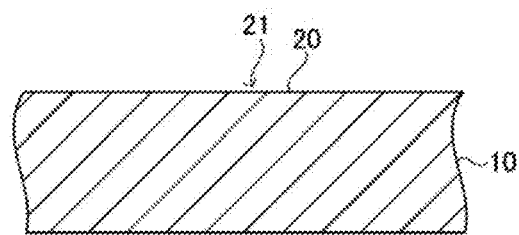
FIGS. 3 (a) to 3 (c) are schematic cross-sectional views of a wafer, illustrating a PEC etching step and a flattening etching step collectively according to a first embodiment of the present invention.
Figure 3B:
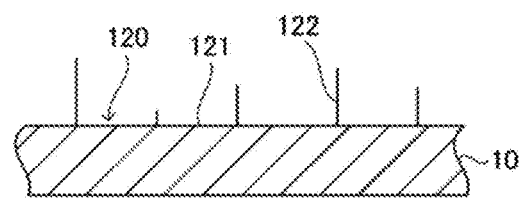
Figure 3C:
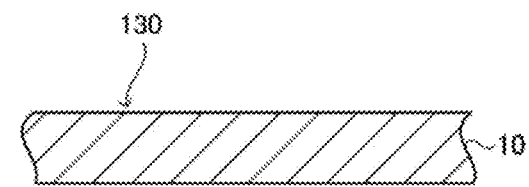

FIGS. 3 (*a*) to 3 (*c*) are schematic cross-sectional views of the wafer 10, illustrating the PEC etching step and the flattening etching step collectively according to a first embodiment. FIG. 3 (*a*) illustrates the wafer 10 before the start of the PEC etching.

FIG. 3 (*b*) illustrates the wafer 10 after the finish of the PEC etching (and before the start of the flattening etching). In the wafer 10 after the finish of the PEC etching (and before the start of the flattening etching), the surface 120 after PEC, which is a PEC-etched surface 20, is formed, and a flat portion 121 and a protruding portion 122 are formed on the surface 120 after PEC.

FIG. 3 (*c*) illustrates the wafer 10 after the flattening etching is finished. In the wafer 10 after the flattening etching is finished, a surface 130 (hereinafter, also referred to as a surface 130 after flattened) is formed, which is the surface 120 after PEC having a lowered (removed) protruding portion 122.

After the flattening etching step is finished, that is, after the wafer 10 (processed wafer 10) subjected to the PEC etching and the flattening etching is obtained, other steps (electrode forming step, etc.) are performed according to a configuration of the structure 150 to be obtained. In this way, the structure 150 is manufactured.

Figure 4A:
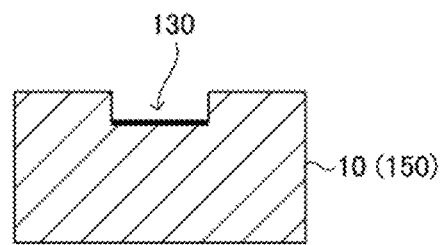
FIGS. 4 (a) to 4 (c) are schematic cross-sectional views illustrating a shape of a processed wafer (structure).
Figure 4B:
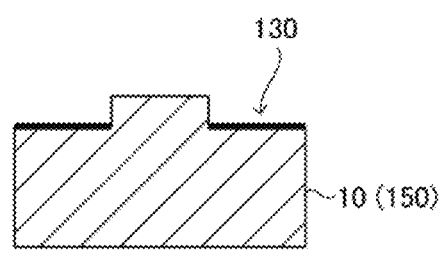
Figure 4C:
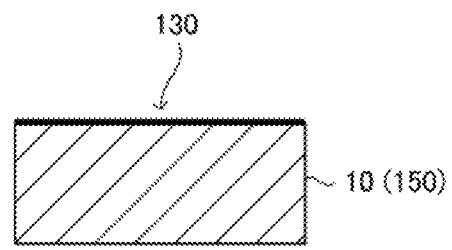

FIGS. 4 (*a*) to 4 (*c*) are schematic cross-sectional views illustrating a shape of the wafer 10 after processing (processed wafer 10). The surface 130 after flattened is shown by a thick line. The shape of the processed wafer 10 is not particularly limited, and may be appropriately selected depending on the configuration of the structure 150 to be manufactured. FIG. 4 (*a*) exemplifies a shape in which a recess portion is formed in the processed wafer 10 (a shape in which the recess portion is removed by PEC etching), and FIG. 4 (*b*) exemplifies a shape in which a protruding portion is formed on the processed wafer 10 (a shape in which an outer portion of the protruding portion is removed by PEC etching), and FIG. 4 (*c*) exemplifies a shape in which the processed wafer 10 has a flat plate shape (a shape in which an entire surface 20 of the wafer 10 is removed by PEC etching).

As described above, according to the flattening etching of the present embodiment, the flatness of the formed surface can be improved by applying the PEC etching to the wafer 10.

Next, an experimental example relating to the PEC etching and the flattening etching will be described. In this experimental example, an epitaxial substrate having the following growth substrate and group III nitride layer, was used. The growth substrate was a semi-insulating SiC substrate. The Group III nitride layer (hereinafter also referred to as an epi layer) has a laminated structure of a nucleation layer composed of AlN, a channel layer composed of GaN and having a thickness of 0.75 m, a barrier layer composed of AlGaN (Al composition 0.22) and having a thickness of 24 nm, and a cap layer composed of GaN and having a thickness of 5 nm.

A recess portion was formed in the epi layer by PEC etching. The PEC etching was performed for 120 minutes using a 0.025 M $K_2S_2O_8$ aqueous solution as an etching solution and irradiating with UV light having a wavelength of 260 nm at an intensity of 3.8 mW/cm². A wafer placement depth L was 5 mm. The mask was made of silicon oxide and the cathode pad was made of titanium. A recess portion with a depth of 23.2 nm was formed. Since the thickness of the cap layer is 5 nm and the thickness of the barrier layer is 24 nm, the thickness of the barrier layer remaining under the recess portion is 5.8 nm.

After the PEC etching, the bottom of the recess portion was flattened by flattening etching. The flattening etching was performed for 10 minutes using hydrochloric acid hydrogen peroxide (for example, a mixture of 30% HCl and 30% $H_2O_2$ at a ratio of 1:1) as an etching solution.

A 1000 nm square region was observed using an atomic force microscope (AFM), for each of the surface of the epi layer before PEC etching (hereinafter referred to as an epi layer surface), the bottom of the recess portion formed by PEC etching and not flattened (hereinafter referred to as an unflattened bottom), and the bottom of the recess portion that has been flattened after PEC etching (hereinafter referred to as a flattened bottom).

Figure 5:
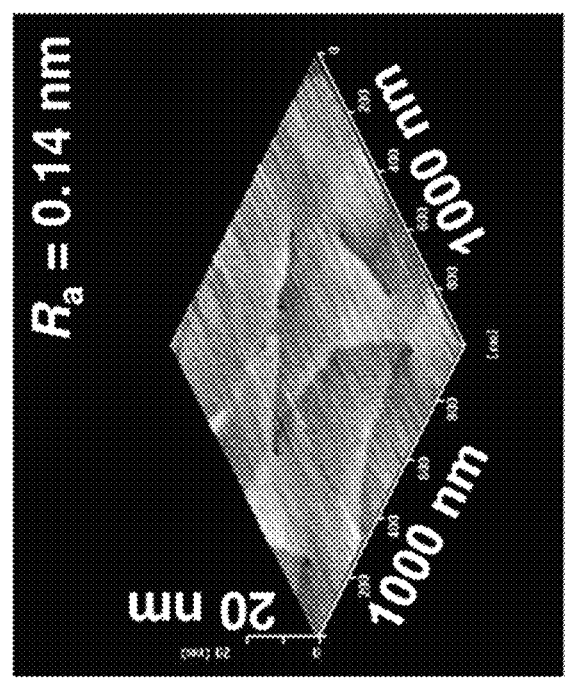
FIG. 5 is an AFM image of a surface of an epi layer in an experimental example.

FIG. 5 is an AFM image of the surface of the epi layer. Arithmetic mean roughness (Ra) obtained by AFM measurement on the surface of the epi layer is 0.14 nm. Since the epi layer is desired to have high crystallinity, Ra on the surface of the epi layer is preferably 0.4 nm or less, more preferably 0.3 nm or less, and further preferably 0.2 nm or less.

Figure 6B:
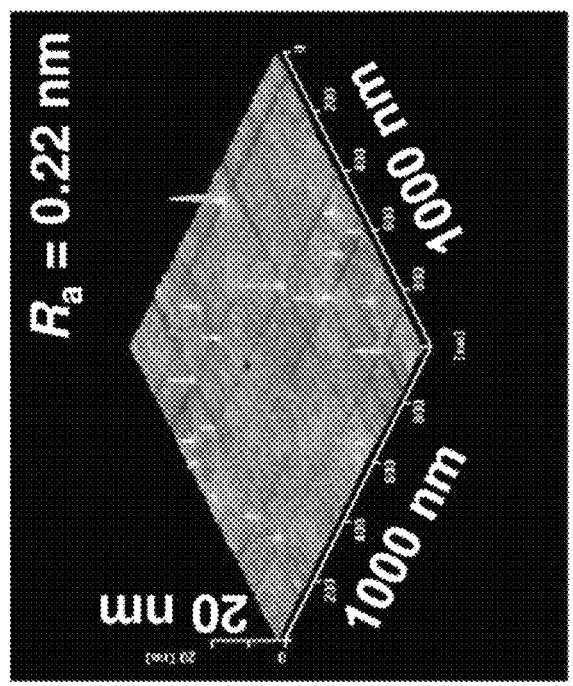
FIG. 6 (a) is an AFM image of the unflattened bottom in the experimental example, and FIG. 6 (b) is an AFM image of the flattened bottom in the experimental example.
Figure 6A:
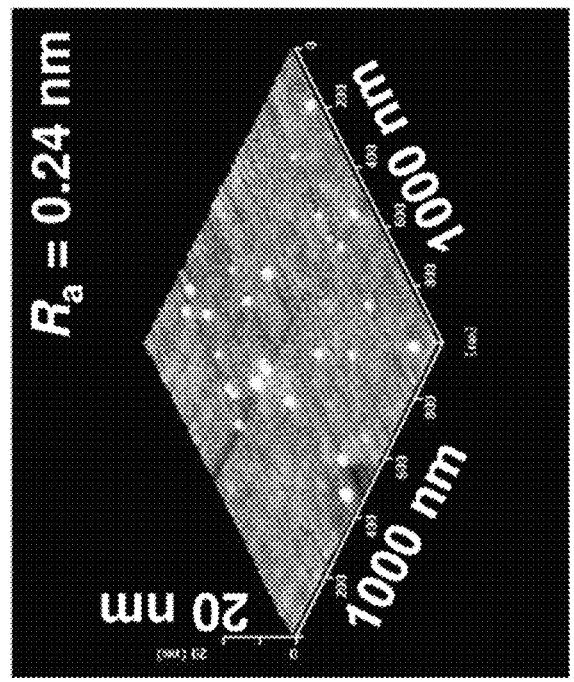
Figure 7A:
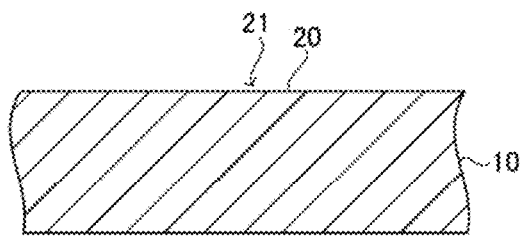
FIGS. 7 (a) to 7 (e) are schematic cross-sectional views of a wafer illustrating the PEC etching step and the flattening etching step collectively according to a second embodiment.
Figure 7B:
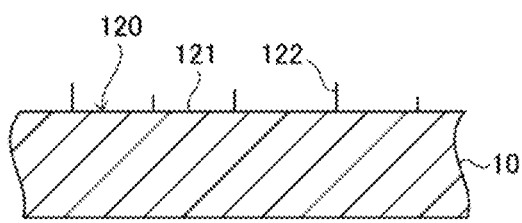
Figure 7C:
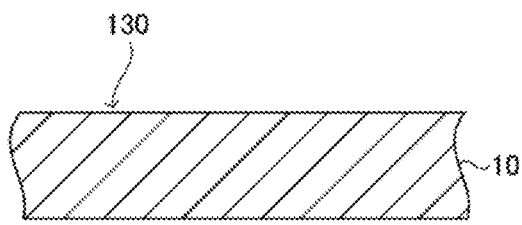
Figure 7D:
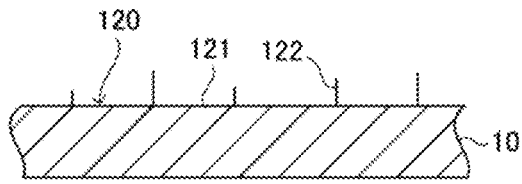
Figure 7E:
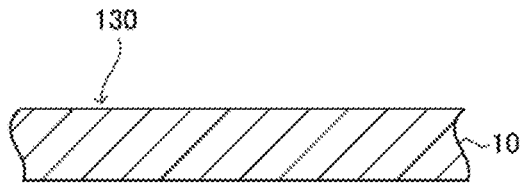

FIG. 6 (a) is an AFM image of the unflattened bottom. On the unflattened bottom, a protruding portion is observed at a position corresponding to a dislocation. There is a tendency that the heights of the plurality of protruding portions distributed on the unflattened bottom, are not constant. The height of a maximum protruding portion exceeds 10 nm.

Ra obtained by AFM measurement on the unflattened bottom is 0.22 nm. Ra on the surface of the epi layer is, for example, 0.14 nm, while Ra on the unflattened bottom is, for example, 0.22 nm. Although the unflattened bottom has a protruding portion, its Ra is, for example, twice or less the Ra on the surface of the epi layer, and does not increase so much. It can be said that the reason for this is that the PEC etching was performed so that the flat portion, which occupies most of an area of the unflattened bottom, has high flatness, that is, so that the high flatness of the epi layer surface is almost not impaired in the flat portion.

FIG. 6 (b) is an AFM image of the flattened bottom. In the flattened bottom, the protruding portion observed in the unflattened bottom is not clearly observed, and it is found that the bottom of the protruding portion is flattened. On the flattened bottom, a position where the protruding portion is presumed to have been formed, that is, a position corresponding to the dislocation, is observed as a bright region separately from the flat portion.

Ra obtained by AFM measurement on the flattened bottom is 0.24 nm. Ra of the unflattened bottom is, for example, 0.22 nm, while Ra of the flattened bottom is slightly larger, for example, 0.24 nm, and this difference is considered to be an error due to a difference between a measurement area of the unflattened bottom and a measurement area of the flattened bottom, and Ra of the unflattened bottom and Ra of the flattened bottom are considered to be about the same. It can be said that it is difficult to clearly distinguish between the unflattened bottom and the flattened bottom only by Ra. From the AFM image of the flattened bottom, it is found that the protruding portion can be selectively etched with respect to the flat portion by the flattening etching.

In the surface 120 (surface after PEC) subjected to the PEC etching, there is less damage to the Group III nitride crystal (as compared to, for example, dry etching) due to the etching to form the recess portion 110.

Further, in the surface 120 (surface after PEC) subjected to the PEC etching, halogen element residue is less than that of the surface when the wafer 10 is processed by dry etching. When trying to process the wafer 10 by dry etching, an etching gas containing a halogen element is made to collide with the surface 20 or a reaction for halogenating the surface 20 is used, and therefore the halogen element remains in the surface after processing (inside the surface layer portion having a predetermined thickness). Compared to such dry etching, the PEC etching and the flattening etching in the present embodiment can be performed as wet etching so that the halogen element does not remain in the surface 120 after PEC and the surface 130 after flattened (inside of the surface layer portion having a predetermined thickness) of the recess portion 110. The concentration of the halogen element (eg, chlorine (Cl)) in the surface 120 after PEC and the surface 130 after flattened is preferably less than $1 \times 10^{15}/cm^3$, more preferably less than $5 \times 10^{14}/cm^3$, and even more preferably less than $2 \times 10^{14}/cm^3$.

Next, a second embodiment will be described. The first embodiment is an embodiment in which the flattening etching is performed after finishing the PEC etching, that is, an embodiment in which one flattening etching is performed after performing one PEC etching to a final depth.

The second embodiment is an embodiment in which the flattening etching is performed at a stage where the PEC etching is performed to a middle depth before performing the PEC etching to a final depth, thereafter, the PEC etching is performed again. That is, the present embodiment is an embodiment in which the PEC etching and the flattening etching are repeated alternately. The flattening etching may be performed a plurality of times as needed. In the same manner as in the first embodiment, the flattening etching may be performed after the PEC etching is finished (performed to the final depth).

It can be also said that the second embodiment is an embodiment in which one PEC-etching is performed to a partial depth of a total depth, and after each PEC etching, the flattening etching is performed.

FIGS. 7 (a) to 7 (e) are schematic cross-sectional views of the wafer 10, illustrating the PEC etching step and the flattening etching step collectively according to the second embodiment. FIG. 7 (a) illustrates the wafer 10 before the start of the PEC etching.

FIG. 7 (b) illustrates the wafer 10 at a stage where the first PEC etching is performed to a partial depth. FIG. 7 (c) illustrates the wafer 10 at a stage where the wafer 10 illustrated in FIG. 7 (b) is subjected to the flattening etching. FIG. 7 (d) illustrates the wafer 10 at a stage where the flattening etching illustrated in FIG. 7 (c) is followed by the second PEC etching to a partial depth. FIG. 7 (e) illustrates the wafer 10 at a stage where the wafer 10 illustrated in FIG. 7 (d) is subjected to the flattening etching.

In the second embodiment, the depth of etching by one PEC etching is shallow, compared to the first embodiment. Therefore, in the second embodiment (see FIGS. 7 (b) and 7 (d)), the formed protruding portions 122 are generally lower than those of the first embodiment (see FIG. 3 (b)), and the difference in height between the protruding portions 122 is small.

Accordingly, in the flattening etching (per one time) of the present embodiment, it becomes easy to etch the protruding portion 122, and it becomes easy to make the height of the protruding portion 122 after etching uniform. Then, by repeating the flattening etching a plurality of times, the protruding portion 122 can be etched more reliably. Thereby, according to the present embodiment, the flatness of a finally obtained surface 130 after flattened can be further improved.

Other Embodiments

The embodiment of the present invention has been specifically described above. However, the present invention is not limited to the above-described embodiment, and various changes, improvements, combinations, and the like can be made without departing from the gist thereof.

For example, a method other than the above-described method may be used as the flattening etching. The above-described embodiment is an embodiment in which wet etching (not PEC etching) using an acidic or alkaline etching solution is used as the flattening etching, that is, an embodiment in which the protruding portion 122 is chemically etched. A mechanism of the flattening etching is not particularly limited as long as the protruding portion 122 is etched so that the surface 120 after PEC is flattened. Therefore, the flattening etching may be performed by etching of a mechanism other than chemical etching. By combining etchings of a plurality of mechanisms, the flattening etching may be performed more effectively.

The flattening etching may be performed, for example, by mechanically removing the protruding portion 122, for example, bubbling cleaning may be used, or, for example, scrub cleaning may be used as the mechanical flattening etching. Examples of the etching solution (cleaning solution) for bubbling cleaning include hydrochloric acid hydrogen peroxide exemplified in the above-described embodiment. When the protruding portion 122 is etched with hydrogen peroxide, bubbles are violently generated. Therefore, the protruding portion 122 can be destroyed and removed by an impact caused by the generation of the bubbles. Hydrochloric acid hydrogen peroxide can be said to be an etching solution that chemically and mechanically etches the protruding portion 122.

Figure 9:
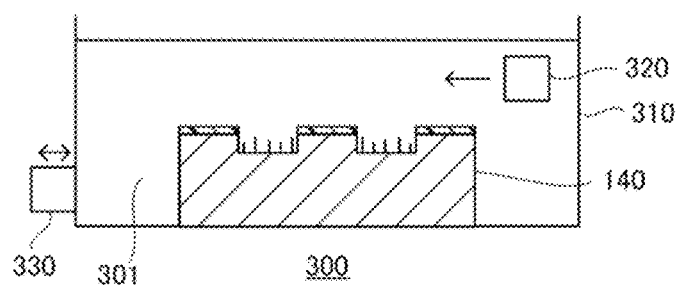
FIG. 9 is a schematic cross-sectional view of a flattening etching apparatus according to another embodiment.

Further, for example, the following may be used as the flattening etching apparatus 300. FIG. 9 is a schematic cross-sectional view of the flattening etching apparatus 300 according to other embodiment. The flattening etching apparatus 300 of other embodiment has a configuration in which a flow generation mechanism 320 and a vibration generation mechanism 330 are added to the flattening etching apparatus 300 according to the above-described embodiment. The flow generation mechanism 320 causes the etching solution 301 to generate a flow (movement). The vibration generation mechanism 330 is, for example, an ultrasonic generator, and gives vibration to the etching solution 301. In this modified example, by generating a flow (movement) in the etching solution 301 and by giving vibration to the etching solution 301, that is, by performing at least one of them, it becomes possible to enhance an action of mechanically etching the protruding portion 122.

Hereinafter, preferable aspects of the present invention will be supplementarily described.

(Supplementary Description 1)

There is provided a method for manufacturing a structure, including:
  applying a first etching to a surface of a member, at least the surface being composed of Group III nitride; and
  applying a second etching to the surface to which the first etching has been applied,
  wherein in applying the first etching, a flat portion and a protruding portion are formed, the flat portion being newly appeared on the surface by etching, and the protruding portion being raised with respect to the flat portion, which is caused by being less likely to be etched than the flat portion, and
  in applying the second etching, the protruding portion is lowered by etching the protruding portion (selectively for flat portion).

(Supplementary Description 2)

There is provided the method for manufacturing a structure according to the supplementary description 1, wherein the protruding portion is formed at a position corresponding to a dislocation of the Group III nitride constituting the member.

(Supplementary Description 3)

There is provided the method for manufacturing a structure according to the supplementary description 1 or 2, wherein the surface is composed of a c-plane of the Group III nitride, and the Group III nitride is etched from a direction perpendicular to the surface in the first etching, and the protruding portion is etched from a direction that is not perpendicular to the c-plane in the second etching.

(Supplementary Description 4)

There is provided the method for manufacturing a structure according to the supplementary description 3, wherein the first etching is photoelectrochemical etching.

(Supplementary Description 5)

There is provided the method for manufacturing a structure according to the supplementary description 3 or 4, wherein the second etching is wet etching using an acidic or alkaline etching solution (rather than photoelectrochemical etching).

(Supplementary Description 6)

There is provided the method for manufacturing a structure according to any one of the supplementary descriptions 1 to 5, wherein the Group III nitride is etched from a direction perpendicular to the surface in the first etching, and the protruding portion is mechanically removed in the second etching.

(Supplementary Description 7)

There is provided the method for manufacturing a structure according to the supplementary description 6, wherein the first etching is photoelectrochemical etching.

(Supplementary Description 8)
There is provided the method for manufacturing a structure according to the supplementary description 6 or 7, wherein the second etching is bubbling cleaning.
(Supplementary Description 9)
There is provided the method for manufacturing a structure according to any one of the supplementary descriptions 6 to 8, wherein the second etching is scrubbing.
(Supplementary Description 10)
There is provided the method for manufacturing a structure according to any one of the supplementary descriptions 1 to 9, wherein the first etching is photoelectrochemical etching in which by irradiating the surface with ultraviolet light from above, the Group III nitride is etched from a direction perpendicular to the surface.
(Supplementary Description 11)
There is provided the method for manufacturing a structure according to any one of the supplementary descriptions 1 to 10, wherein the surface is not irradiated with ultraviolet light (that causes photoelectrochemical etching) in the second etching.
(Supplementary Description 12)
There is provided the method for manufacturing a structure according to any one of the supplementary descriptions 1 to 11, wherein the protruding portion is selectively etched with respect to the flat portion in the second etching.
(Supplementary Description 13)
There is provided the method for manufacturing a structure according to any one of the supplementary descriptions 1 to 12, wherein the first etching is photoelectrochemical etching, and an etching solution for the photoelectrochemical etching is an alkaline or acidic etching solution containing an oxidizing agent that receives electrons.
(Supplementary Description 14)
There is provided the method for manufacturing a structure according to any one of the supplementary descriptions 1 to 13, wherein the first etching is photoelectrochemical etching, and
  in the first etching, a distance from the surface to an upper surface of an etching solution for the photoelectrochemical etching is preferably 1 mm or more and 100 mm or less, more preferably 3 mm or more and 100 mm or less, and further preferably 5 mm or more and 100 mm or less.
(Supplementary Description 15)
There is provided the method for manufacturing a structure according to any one of the supplementary descriptions 1 to 14, wherein the first etching is photoelectrochemical etching,
  the photoelectrochemical etching is performed in the first etching, with a mask placed on the surface,
  an etching solution for the photoelectrochemical etching is an acidic etching solution (from a start of the first etching), and
  the mask is a resist mask.
(Supplementary Description 16)
There is provided the method for manufacturing a structure according to any one of the supplementary descriptions 1 to 15,
  wherein the first etching is photoelectrochemical etching,
  the photoelectrochemical etching is performed with a mask and a conductive member placed on the surface,
  the mask is made of a non-conductive material,
  the conductive member is provided so as to be in contact with at least a part of a surface of a conductive region of the member, which is electrically connected to a region to be subjected to the photoelectrochemical etching, and
  at least a part (upper surface) of the conductive member is provided so as to be in contact with an etching solution for the photoelectrochemical etching.
(Supplementary Description 17)
There is provided the method for manufacturing a structure according to any one of the supplementary descriptions 1 to 16, wherein the first etching and the second etching are alternately repeated.
(Supplementary Description 18)
There is provided the method for manufacturing a structure according to any one of the supplementary descriptions 1 to 17, wherein the second etching is performed while generating a flow (movement) in an etching solution used for the second etching.
(Supplementary Description 19)
There is provided the method for manufacturing a structure according to any one of the supplementary descriptions 1 to 18, wherein the second etching is performed while applying vibration to an etching solution used for the second etching.

DESCRIPTION OF SIGNS AND NUMERALS

10 ... wafer, 11 ... substrate, 12 ... epi layer, 20 ... surface (of wafer), 21 ... region to be etched, 30 ... cathode pad, 50 ... mask, 100 ... PEC object, 110 ... removal portion, 120 ... surface after PEC, 121 ... flat part, 122 ... protruding portion, 130 ... surface after flattened, 140 ... flattening object, 150 ... structure, 151 ... source electrode, 152 ... gate electrode, 153 ... drain electrode, 160 ... element separation groove, 200 ... PEC etching apparatus, 201 ... etching liquid, 210 ... container, 220 ... light source, 221 ... UV light, 300 ... flattening etching device, 301 ... etching liquid, 310 ... container, 320 ... flow generation mechanism, 330 ... vibration generation mechanism

The invention claimed is:

1. A method for manufacturing a structure, comprising:
  applying a first etching to a surface of a member, at least the surface being composed of Group III nitride; and
  applying a second etching to the surface to which the first etching has been applied,
  wherein in applying the first etching, a flat portion and a protruding portion are formed, the flat portion being newly appeared on the surface by etching, and the protruding portion being raised with respect to the flat portion, which is caused by being less likely to be etched than the flat portion, and
  in applying the second etching, the protruding portion is lowered by etching the protruding portion, and
  wherein the first etching is photoelectrochemical etching, the second etching is not photoelectrochemical etching, and the surface is not irradiated with ultraviolet light in the second etching.

2. The method for manufacturing a structure according to claim 1, wherein the protruding portion is formed at a position corresponding to a dislocation of the Group III nitride constituting the member.

3. The method for manufacturing a structure according to claim 1, wherein the surface is composed of a c-plane of the Group III nitride, and the Group III nitride is etched from a direction perpendicular to the surface in the first etching, and the protruding portion is etched from a direction that is not perpendicular to the c-plane in the second etching.

4. The method for manufacturing a structure according to claim 1, wherein the second etching is wet etching using an acidic or alkaline etching solution.

5. The method for manufacturing a structure according to claim 1, wherein the first etching is photoelectrochemical etching in which by irradiating the surface with ultraviolet light from above, the Group III nitride is etched from a direction perpendicular to the surface.

6. The method for manufacturing a structure according to claim 1, wherein the protruding portion is selectively etched with respect to the flat portion in the second etching.

7. The method for manufacturing a structure according to claim 1, wherein an etching solution for the photoelectrochemical etching is an alkaline or acidic etching solution containing an oxidizing agent that receives electrons.

8. The method for manufacturing a structure according to claim 1,
wherein
in the first etching, a distance from the surface to an upper surface of an etching solution for the photoelectrochemical etching is 1 mm or more and 100 mm or less.

9. The method for manufacturing a structure according to claim 1,
wherein
the photoelectrochemical etching is performed in the first etching, with a mask placed on the surface,
an etching solution for the photoelectrochemical etching is an acidic etching solution, and
the mask is a resist mask.

10. The method for manufacturing a structure according to claim 1,
wherein
the photoelectrochemical etching is performed with a mask and a conductive member placed on the surface,
the mask is made of a non-conductive material,
the conductive member is provided so as to be in contact with at least a part of a surface of a conductive region of the member, which is electrically connected to a region to be subjected to the photoelectrochemical etching, and
at least a part of the conductive member is provided so as to be in contact with an etching solution for the photoelectrochemical etching.

11. The method for manufacturing a structure according to claim 1, wherein the first etching and the second etching are alternately repeated.

12. The method for manufacturing a structure according to claim 1, wherein the second etching is performed while generating a flow in an etching solution used for the second etching.

13. The method for manufacturing a structure according to claim 1, wherein the second etching is performed while applying vibration to an etching solution used for the second etching.

14. The method for manufacturing a structure according to claim 1, wherein the Group III nitride is etched from a direction perpendicular to the surface in the first etching, and the protruding portion is mechanically removed in the second etching.

15. The method for manufacturing a structure according to claim 14, wherein the second etching is bubbling cleaning.

16. The method for manufacturing a structure according to claim 14, wherein the second etching is scrubbing.

* * * * *